United States Patent
Lai et al.

(10) Patent No.: US 9,847,133 B2
(45) Date of Patent: Dec. 19, 2017

(54) MEMORY ARRAY CAPABLE OF PERFORMING BYTE ERASE OPERATION

(71) Applicant: eMemory Technology Inc., Hsin-Chu (TW)

(72) Inventors: Tsung-Mu Lai, Hsinchu County (TW); Chih-Hsin Chen, Changhua County (TW); Shih-Chen Wang, Taipei (TW); Chen-Hao Po, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/150,440

(22) Filed: May 10, 2016

(65) Prior Publication Data

US 2017/0206970 A1 Jul. 20, 2017

Related U.S. Application Data

(60) Provisional application No. 62/280,683, filed on Jan. 19, 2016.

(51) Int. Cl.
*G11C 11/34* (2006.01)
*G11C 16/16* (2006.01)
*G11C 16/10* (2006.01)

(52) U.S. Cl.
CPC ............. *G11C 16/16* (2013.01); *G11C 16/10* (2013.01)

(58) Field of Classification Search
CPC ................................ G11C 16/16; G11C 16/10
See application file for complete search history.

(56) References Cited

U.S. PATENT DOCUMENTS

| | | | |
|---|---|---|---|
| 4,617,652 A | 10/1986 | Simko | |
| 6,141,250 A | 10/2000 | Kashimura | |
| 7,263,001 B2 | 8/2007 | Wang | |
| 7,391,647 B2 | 6/2008 | Fang | |
| 7,663,916 B2 | 2/2010 | Chih | |
| 7,791,955 B2 | 9/2010 | Ratnakumar | |
| 8,139,411 B1 | 3/2012 | Pesavento | |
| 8,279,681 B2 | 10/2012 | Yao | |
| 8,284,600 B1 * | 10/2012 | Poplevine | G11C 16/0441 365/104 |
| 8,625,350 B2 | 1/2014 | Ching | |
| 8,743,585 B2 | 6/2014 | Chiu | |

(Continued)

FOREIGN PATENT DOCUMENTS

| | | |
|---|---|---|
| JP | 200021183 A | 1/2000 |
| JP | 2000114499 A | 4/2000 |

(Continued)

*Primary Examiner* — Richard Elms
*Assistant Examiner* — Mohammed A Bashar
(74) *Attorney, Agent, or Firm* — Winston Hsu (57) ABSTRACT

A memory array includes a plurality of memory pages, each memory page includes a plurality of memory bytes, each memory byte includes a plurality of memory cells, and each memory cell includes a floating gate module, a control element, and an erase element. Memory bytes of the same column are coupled to the same erase line, and memory bytes of different columns are coupled to different erase lines. Therefore, the memory array is able to support byte operations while the memory cells of the same memory byte can share the same wells. The circuit area of the memory array can be reduced and the operation of the memory array can be more flexible.

9 Claims, 9 Drawing Sheets

(56) References Cited

U.S. PATENT DOCUMENTS

| | | |
|---|---|---|
| 8,787,092 B2 | 7/2014 | Chen |
| 8,958,245 B2 | 2/2015 | Hsu |
| 9,042,174 B2 | 5/2015 | Ching |
| 9,425,204 B2 | 8/2016 | Ching |
| 2004/0240273 A1 | 12/2004 | Sakui |
| 2006/0138245 A1 | 6/2006 | Lee |
| 2007/0058441 A1 | 3/2007 | Oka |
| 2007/0247914 A1* | 10/2007 | Fang .................. G11C 16/0408 365/185.18 |
| 2008/0205144 A1* | 8/2008 | Yamamoto ......... G11C 16/0441 365/185.05 |
| 2013/0009163 A1 | 1/2013 | Ueda |
| 2013/0214341 A1 | 8/2013 | Wang |
| 2014/0177338 A1 | 6/2014 | Ching |

FOREIGN PATENT DOCUMENTS

| | | | |
|---|---|---|---|
| JP | 2000276889 | A | 10/2000 |
| JP | 2004326864 | A | 11/2004 |
| JP | 2013102119 | A | 5/2013 |
| JP | 201570264 | A | 4/2015 |
| TW | 200746148 | | 12/2007 |
| TW | I469328 | B | 1/2015 |
| WO | 2011096978 | A2 | 8/2011 |

\* cited by examiner

MEMORY ARRAY CAPABLE OF PERFORMING BYTE ERASE OPERATION

CROSS REFERENCE TO RELATED APPLICATIONS

This non-provisional application claims priority of U.S. provisional application No. 62/280,683, filed on Jan. 19, 2016, included herein by reference in its entirety.

BACKGROUND OF THE INVENTION

1. Field of the Invention

This invention relates to a memory array, and more particularly, a multi-time programmable nonvolatile memory array that is capable of performing a byte erase operation.

2. Description of the Prior Art

An electrically rewritable nonvolatile memory is a type of memory that retains information it stores even when no power is supplied to memory blocks and allows on-board rewriting of a program. Due to the wide range of applications for various uses, there is a growing need for a nonvolatile memory to be embedded in the same chip with the main circuit, especially for personal electronic devices having strict requirements for circuit area.

A nonvolatile memory cell of prior art comprises one floating gate transistor for retaining data, and one or two select transistors for enabling the floating gate transistor to perform corresponding operations. The floating gate may be controlled by coupling elements for program operations and erase operations.

Since memory cells in different pages or sectors should be controlled independently, memory cells indifferent pages or sectors are usually disposed in isolated regions when the operations of the memory cells involves in changing of well(body) bias. However, due to the spacing rule of the manufacture, the spare area between different isolated regions can significantly increase the circuit area on silicon. Furthermore, for system requiring byte operations, such as byte program or byte erase, may further complicate the control signals received by memory cell and make the area sharing even more difficult. Therefore, how to reduce the circuit area and use the circuit area more efficiently has become an issue to be solved.

SUMMARY OF THE INVENTION

One embodiment of the present invention discloses a memory array. The memory array includes a plurality of memory pages. Each memory page includes a plurality of memory bytes, each memory byte includes a plurality of memory cells, and each memory cell includes a floating gate module, a control element, and an erase element.

The floating gate module includes a floating gate transistor, a source transistor, and a bit transistor. The floating gate transistor has a first terminal, a second terminal and a floating gate. The source transistor has a first terminal coupled to a source line, a second terminal coupled to the first terminal of the floating gate transistor, and a control terminal coupled to a word line. The bit transistor has a first terminal coupled to the second terminal of the floating gate transistor, a second terminal coupled to a bit line, and a control terminal coupled to the word line.

The control element has a body terminal coupled to a control line, a first terminal coupled to the body terminal, a second terminal coupled to the body terminal, and a control terminal coupled to the floating gate. The erase element has a body terminal, a first terminal coupled to an erase line, a second terminal, and a control terminal coupled to the floating gate.

Memory bytes of a same column are coupled to a same erase line, and memory bytes of different columns are coupled to different erase lines.

Another embodiment of the present invention discloses a memory array. The memory array includes a plurality of memory pages. Each memory page includes a plurality of memory bytes, each memory byte includes a plurality of memory cells, and each memory cell includes a floating gate module, a control element, and an erase element.

The floating gate module includes a floating gate transistor, a source transistor, and a bit transistor. The floating gate transistor has a first terminal, a second terminal and a floating gate. The source transistor has a first terminal coupled to a source line, a second terminal coupled to the first terminal of the floating gate transistor, and a control terminal coupled to a word line. The bit transistor has a first terminal coupled to the second terminal of the floating gate transistor, a second terminal coupled to a bit line, and a control terminal coupled to the word line.

The control element has a body terminal coupled to a control line, a first terminal coupled to the body terminal, a second terminal coupled to the body terminal, and a control terminal coupled to the floating gate. The erase element has a body terminal, a first terminal coupled to an erase line, a second terminal, and a control terminal coupled to the floating gate.

Memory bytes of a same column are coupled to a same control line, and memory bytes of different columns are coupled to different control lines.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
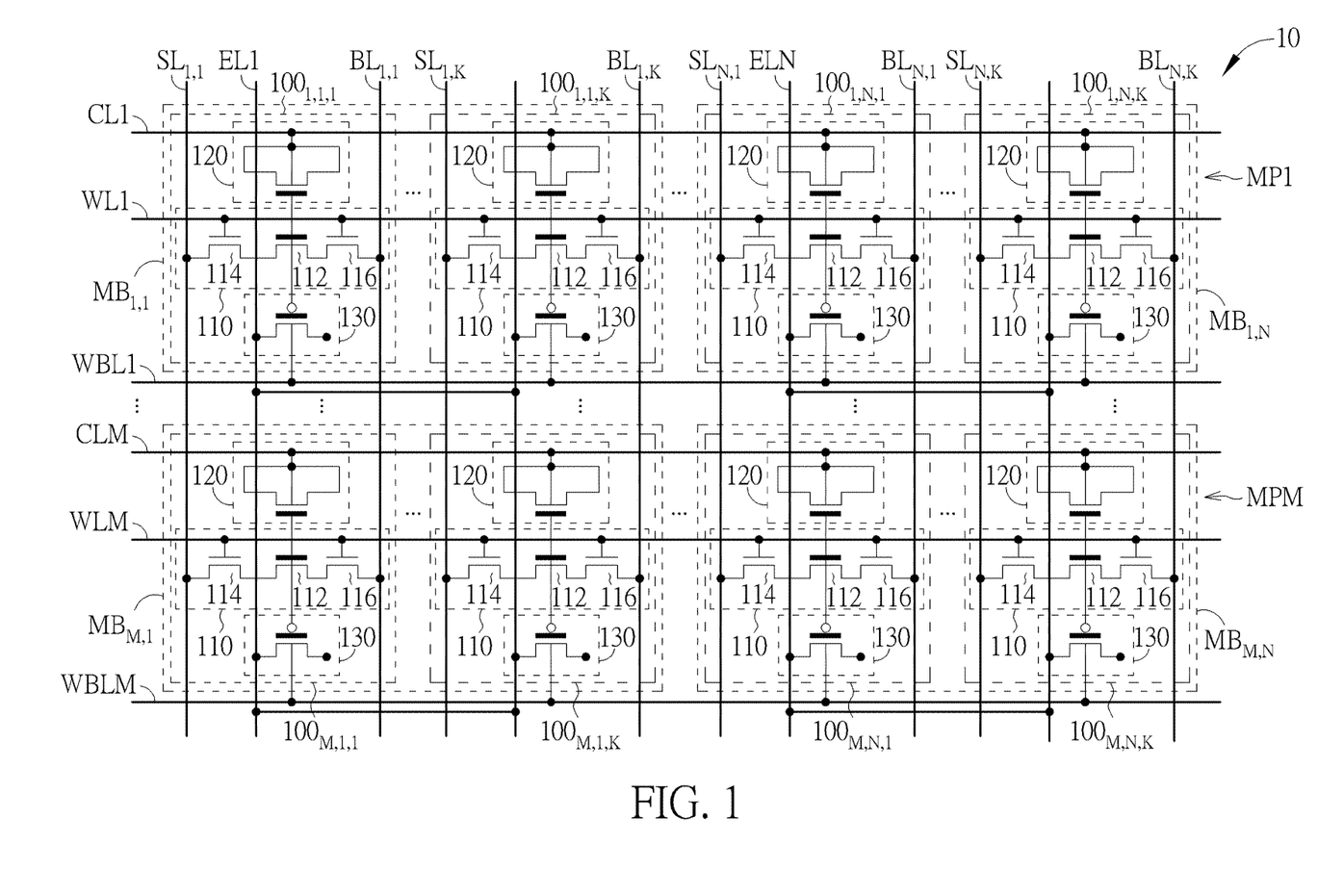
FIG. 1 shows a memory array according one embodiment of the present invention.

FIG. 1 shows a memory array 10 according one embodiment of the present invention. The memory array 10 includes M memory pages MP1 to MPM, each memory page MP1 to MPM includes N memory bytes. For example, the memory page MP1 includes memory bytes $MB_{1,1}$ to $MB_{1,N}$, and the memory page MPM includes memory bytes $MB_{M,1}$ to $MB_{M,N}$. Each of the memory bytes $MB_{1,1}$ to $MB_{1,N}$, . . . , and $MB_{M,1}$ to $MB_{M,N}$ includes K memory cells, where M, N, and K are positive integer. For example, the memory byte $MB_{1,1}$ includes memory cells $100_{1,1,1}$ to $100_{1,1,K}$, the memory byte $MB_{1,N}$ includes memory cells $100_{1,N,1}$ to $100_{1,N,K}$, the memory byte $MB_{M,1}$ includes memory cells $100_{M,1,1}$ to $100_{M,1,K}$, the memory byte $MB_{M,N}$ includes memory cells $100_{M,N,1}$ to $100_{M,N,K}$.

Each memory cell includes a floating gate module 110, a control element 120, and an erase element 130. The floating gate module 110 includes a floating gate transistor 112, a source transistor 114, and a bit transistor 116. The floating gate transistor 112 has a first terminal, a second terminal and a floating gate. The source transistor 114 has a first terminal, a second terminal, and a control terminal. The first terminal of the source transistor 114 is coupled to a corresponding source line, the second terminal of the source transistor 114 is coupled to the first terminal of the floating gate transistor 112, and the control terminal of the source transistor 114 is coupled to a corresponding word line. The bit transistor 116 has a first terminal, a second terminal, and a control terminal. The first terminal of the bit transistor 116 is coupled to the second terminal of the floating gate transistor 112, the second terminal of bit the transistor 116 is coupled to a corresponding bit line, and a control terminal of the bit transistor 116 is coupled to the corresponding word line.

In the memory array 10, memory cells of the same memory page are coupled to the same word line, and memory cells of different memory pages are coupled to different word lines. For example, the memory cells $100_{1,1,1}$ to $100_{1,1,K}$, and $100_{1,N,1}$ to $100_{1,N,K}$ are in the memory page MP1 and are coupled to the same word line WL1. Also, the memory cells $100_{M,1,1}$ to $100_{M,1,K}$ and $100_{M,N,1}$ to $100_{M,N,K}$ are in the memory page MPM and are coupled to the same word line WLM.

Furthermore, memory cells of the same column are coupled to a same source line and a same bit line, and memory cells of different columns are coupled to different source lines and different bit lines. For example, the memory cell $100_{1,1,1}$ and the memory cell $100_{M,1,1}$ are disposed in the same column and are coupled to the same source line $SL_{1,1}$ and the same bit line $BL_{1,1}$. The memory cell $100_{1,1,K}$ and the memory cell $100_{M,1,K}$ are disposed in the same column and are coupled to the same source line $SL_{1,K}$ and the same bit line $BL_{1,K}$. The memory cell $100_{1,N,1}$ and the memory cell $100_{M,N,1}$ are disposed in the same column and are coupled to the same source line $SL_{N,1}$ and the same bit line $BL_{N,1}$. The memory cell $100_{1,N,K}$ and the memory cell $100_{M,N,K}$ are disposed in the same column and are coupled to the same source line $SL_{N,K}$ and the same bit line $BL_{N,K}$. The control element 120 has a body terminal, a first terminal, a second terminal, and a control terminal. The body terminal of the control element 120 is coupled to a corresponding control line, the first terminal of the control element 120 is coupled to the body terminal of the control element 120, the second terminal of the control element 120 is coupled to the body terminal of the control element 120, and the control terminal of the control element 120 is coupled to the floating gate of the floating gate transistor 112.

In the present embodiment, memory cells of the same memory page are coupled to the same control line, and memory cells of different memory pages are coupled to different control lines. For example, the memory cells $100_{1,1,1}$ to $100_{1,1,K}$ and the memory cells $100_{1,N,1}$ to $100_{1,N,K}$ are in the same memory page MP1 and are coupled to the same control line CL1. Also, the memory cells $100_{M,1,1}$ to $100_{M,1,K}$ and the memory cells $100_{M,N,1}$ to $100_{M,N,K}$ are in the same memory page MPM and are coupled to the same control line CLM.

The erase element 130 has a body terminal, a first terminal, a second terminal, and a control terminal. The body terminal of the erase element 130 is coupled a corresponding well bias line, the first terminal of the erase element 130 is coupled to a corresponding erase line, the second terminal of the erase element 130 is coupled to the first terminal of the erase element 130 or is floating, and the control terminal of the erase element 130 is coupled to the floating gate of the floating gate transistor 112.

In the memory array 10, memory bytes of the same column are coupled to the same erase line, and memory bytes of different columns are coupled to different erase lines. For example, the memory byte $MB_{1,1}$ and the memory byte $MB_{M,1}$ are disposed in the same column and are coupled to the same erase line EL1. Also, the memory byte $MB_{1,N}$ and the memory byte $MB_{M,N}$ are disposed in the same column and are coupled to the same erase line ELN. Furthermore, memory cells of the same memory page are coupled to the same well bias line, and memory cells of different memory pages are coupled to different well bias lines. For example, the memory cells $100_{1,1,1}$ to $100_{1,1,K}$ and the memory cells $100_{1,N,1}$ to $100_{1,N,K}$ are in the same memory page MP1 and are coupled to the same well bias line WBL1. Also, the memory cells $100_{M,1,1}$ to $100_{M,1,K}$ and the memory cells $100_{M,N,1}$ to $100_{M,N,K}$ are in the same memory page MPM and are coupled to the same well bias line WBLM.

Since memory bytes of the same memory page are coupled to different erase lines, memory bytes in the same page can be coupled to the same well bias line while memory bytes of the same memory page can still be controlled independently. That is, the memory bytes of the same memory page can be disposed in the same well. By sharing the same well, the circuit area of the memory array 10 can be reduced.

Figure 2:
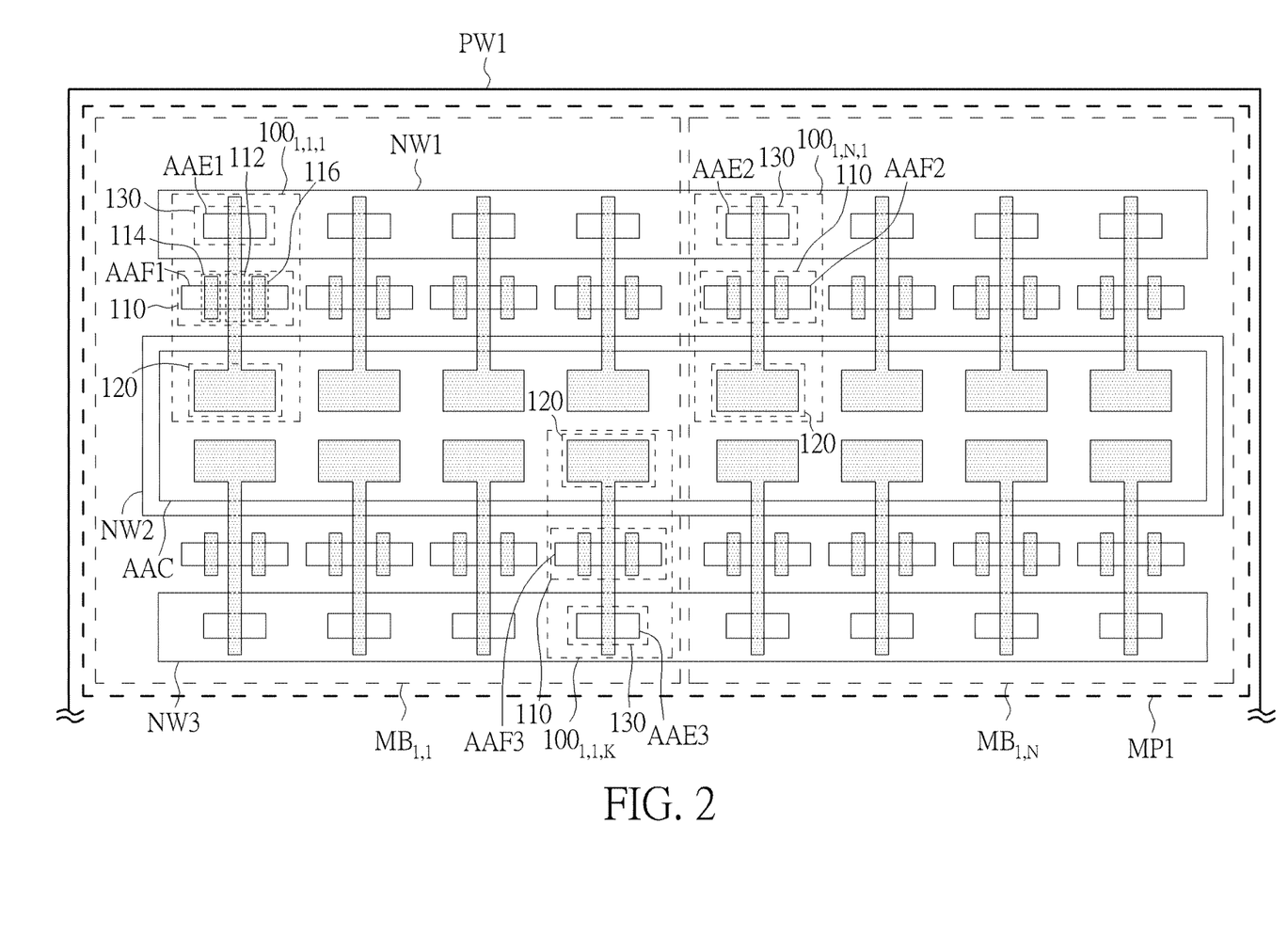
FIG. 2 shows a layout of a memory page of the memory array in FIG. 1 according to one embodiment of the present invention.

FIG. 2 shows a layout of the memory page MP1 of the memory array 10 according to one embodiment of the present invention. The floating gate module 110 of the memory cell $100_{1,1,1}$ can be disposed in an active region AAF1 of a P-well PW1, the erase element 130 of the memory cell $100_{1,1,1}$ can be disposed in an active region AAE1 of an N-well NW1, and the control element 120 of the memory cell $100_{1,1,1}$ can be disposed in an active region AAC of an N-well NW2. The active region AAF1 is disposed between the N-well NW1 and the N-well NW2.

Also, the floating gate module 110 of the memory cell $100_{1,N,1}$ can be disposed in an active region AAF2 of the P-well PW1, the erase element 130 of the memory cell $100_{1,N,1}$ can be disposed in an active region AAE2 of the N-well NW1, and the control element 120 of the memory cell $100_{1,N,1}$ can be disposed in the active region AAC of the N-well NW2. That is, memory bytes $MB_{1,1}$ to $MB_{1,N}$ of the same memory page MP1 can share the same active region AAC in the N-well NW2 as parts of their control elements 120, while memory bytes $MB_{1,1}$ to $MB_{1,N}$ of the same memory page MP1 may use different active regions AAE1 and AAE2 to dispose their erase elements 130 in the N-well NW1 and use different active regions AAF1 and AAF2 to dispose their floating gate modules 110 in the P-well PW1.

Since the memory bytes $MB_{1,1}$ to $MB_{1,N}$ of the same memory page MP1 can share the P-well PW1 and the N-wells NW1 and NW2, the spacing rules between N-wells may not be used to limit the circuit area of the memory array 10, and the circuit area of the memory array 10 can be reduced significantly.

In addition, to avoid the circuit area of the memory array 10 from being extended to only one direction, floating gate modules 110 of one memory byte can be disposed in different active regions of the P-well PW1 and erase elements 130 of memory cells of one memory byte can be disposed in two different N-wells. For example, in FIG. 2, the floating gate module 110 of the memory cell $100_{1,1,1}$ of the memory byte $MB_{1,1}$ can be disposed in the active region AAF1 of the P-well PW1 while floating gate module 110 of the memory cell $100_{1,1,K}$ of the memory byte $MB_{1,1}$ can be disposed in the active region AAF3 of the P-well PW1.

Also, the erase element 130 of the memory cell $100_{1,1,1}$ of the memory byte $MB_{1,1}$ can be disposed in the active region AAE1 of the N-well NW1 while the erase element 130 of the memory cell $100_{1,1,K}$ of the memory byte $MB_{1,1}$ can be disposed in the active region AAE3 of an N-well NW3.

The active regions AAE1 and AAE3 are disposed in opposite directions with respect to the N-well NW2 and the active regions AAF1 and AAF3 are disposed in opposite directions with respect to the N-well NW2 so that the control elements 130 of the memory cells $100_{1,1,1}$ to $100_{1,1,K}$ of the memory byte $MB_{1,1}$ can still be disposed in the same N-well NW2. Also, the active region AAF3 is disposed between the N-well NW2 and the N-well NW3.

In this case, the layout of the memory array 10 will not extend to one single direction, and the layout of the memory array 10 can be more flexible. However, in some embodiments, the floating gate modules 110 of the memory cells $100_{1,1,1}$ to $100_{1,1,K}$ of the same memory byte $MB_{1,1}$ can also be disposed in one P-well and the erase elements 130 of the memory cells $100_{1,1,1}$ to $100_{1,1,K}$ of the same memory byte $MB_{1,1}$ can be disposed in one N-well according to the system requirement.

Figure 3:
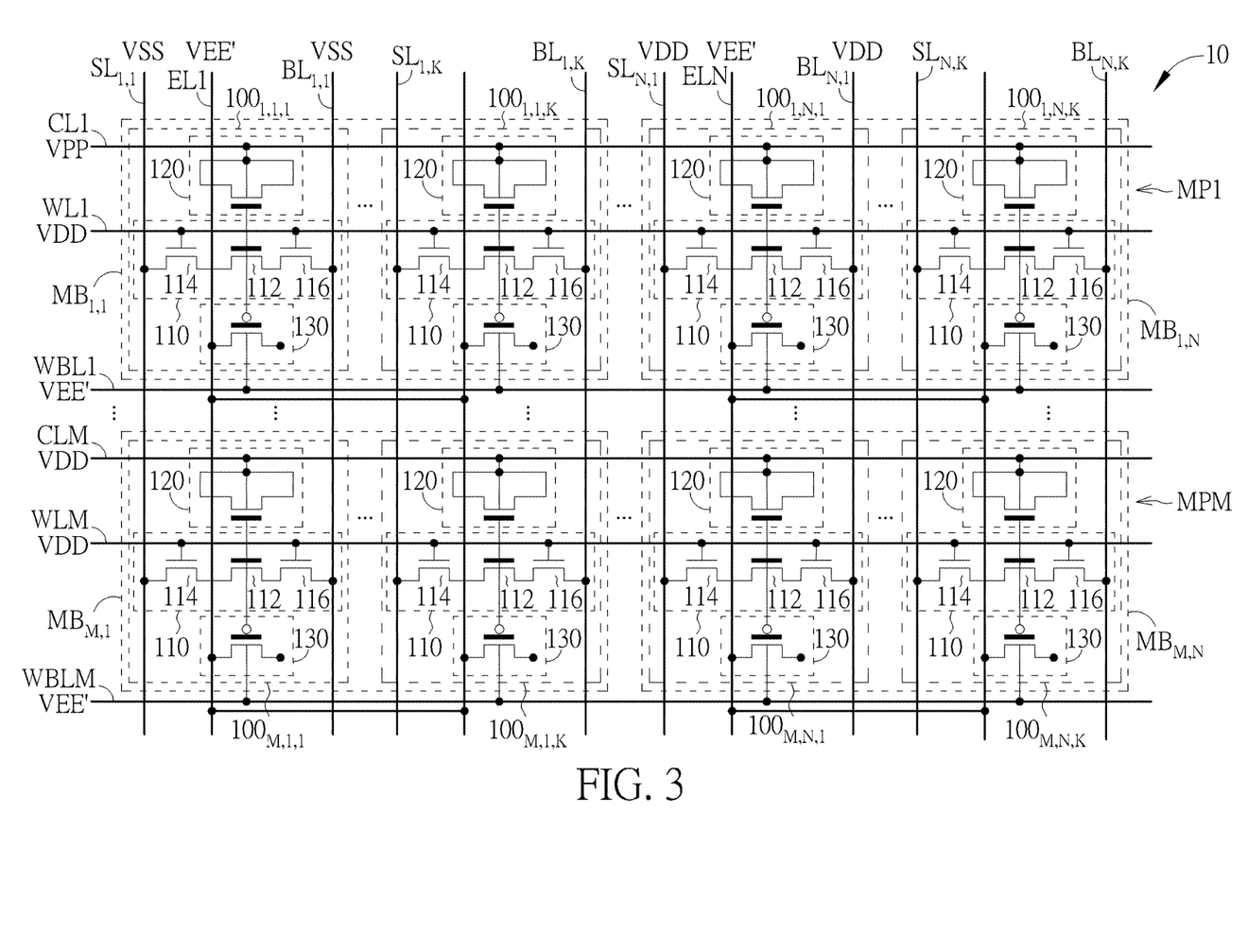
FIG. 3 shows voltages of signal lines during a program operation of a memory cell of the memory array in FIG. 1.

FIG. 3 shows voltages of signal lines during a program operation of the memory cell $100_{1,1,1}$ in the memory array 10. According to FIG. 3, during the program operation of the memory cell $100_{1,1,1}$, the control line CL1 is at a first voltage VPP, the erase line EL1 is at a second voltage VEE', the word line WL1 is at a third voltage VDD, the source line $SL_{1,1}$ is at a fourth voltage VSS, the bit line $BL_{1,1}$ is at the fourth voltage VSS, and the well bias line WBL1 is at the second voltage VEE'.

In some embodiments of the present invention, the first voltage VPP is greater than the second voltage VEE', the second voltage VEE' is greater than the third voltage VDD, and the third voltage VDD is greater than the fourth voltage VSS. Furthermore, the difference between the second voltage VEE' and the fourth voltage VSS can be greater than half of the difference between the first voltage VPP and the fourth voltage VSS, and the difference between the third voltage VDD and the fourth voltage VSS can be smaller than half of the difference between the first voltage VPP and the fourth voltage VSS. For example, the first voltage VPP can be 10V, the second voltage VEE' can be 6V, the third voltage VDD can be 3V, and the fourth voltage VSS can be 0V.

According to FIG. 3, the control element 120 of the memory cell $100_{1,1,1}$ is coupled to a high voltage by the control line CL1. The source transistor 114 and the bit transistor 116 are turned on so the first terminal and the second terminal of the floating gate transistor 112 of the memory cell $100_{1,1,1}$ are pulled down to a low voltage, the fourth voltage VSS. Therefore, the high voltage difference applied to the floating gate transistor 112 will induce FN (Fowler Nordheim) electron tunneling injection to the floating gate, and the memory cell $100_{1,1,1}$ can be programmed.

Also, during the program operation of the memory cell $100_{1,1,1}$, the memory cell $100_{1,N,1}$ is unselected. Therefore, to prevent the memory cell $100_{1,N,1}$ in the same memory page MP1 as the memory cell $100_{1,1,1}$ from being programmed, the memory cell $100_{1,N,1}$ may perform a program inhibit operation during the program operation of the memory cell $100_{1,1,1}$.

During the program inhibit operation of the memory cell $100_{1,N,1}$, the control line CL1 is at the first voltage VPP, the erase line ELN is at the second voltage VEE', the word line WL1 is at the third voltage VDD, the source line $SL_{N,1}$ is at a third voltage VDD, the bit line $BL_{N,1}$ is at the third voltage VDD, and the well bias line is at the second voltage VEE'.

In this case, although the memory cell $100_{1,N,1}$ is coupled to the same control line CL1 and the same word line WL1 as the memory cell $100_{1,1,1}$, the memory cell $100_{1,N,1}$ will not be programmed due to the effect of channel boost caused by the source transistor 114 and the bit transistor 116 of the memory cell $100_{1,N,1}$. That is, right after the voltage of control line CL1 ramping up to the first voltage VPP, the voltages of the first terminal and the second terminal of the floating gate transistor 112 will be isolated from the voltage of the source line $SL_{N,1}$ and the voltage of the bit line $BL_{N,1}$, but being coupled to a higher potential by the voltage of body terminal of the control element 120, so the floating gate of the memory cell $100_{1,N,1}$ is not able to capture enough electrons and the memory cell $100_{1,N,1}$ will not be programmed.

Furthermore, during the program operation of the memory cell $100_{1,1,1}$, memory cells in unselected memory pages should not be programmed. For example, in FIG. 3, the memory cell $100_{M,1,1}$ is in the unselected memory page MPM. However, since the memory cell $100_{M,1,1}$ is in the same column as the memory cell $100_{1,1,1}$, the memory cell $100_{M,1,1}$ and the memory cell $100_{1,1,1}$ are coupled to the same source line $SL_{1,1}$, the same bit line $BL_{1,1}$, and the same erase line EL1.

During the program operation of the memory cell $100_{1,1,1}$, the control line CLM coupled to the unselected memory cell $100_{M,1,1}$ can be at the third voltage VDD, the word line WLM coupled to the unselected memory cell $100_{M,1,1}$ can be at the third voltage VDD, and the well bias line WBLM coupled to the unselected memory cell $100_{M,1,1}$ can be at the second voltage VEE'.

In this case, the memory cell $100_{M,1,1}$ will not be programmed since the voltage of the control line CLM is not high enough to induce FN electron tunneling injection. Also, since the memory cells $100_{1,1,1}$ and $100_{M,1,1}$ are coupled to the same erase line EL1, the voltage of the body terminal of the erase element 130 of the memory cell $100_{M,1,1}$ should not be lower than the voltage of the erase line EL1; otherwise, the forward voltage between the first terminal of the erase element 130 and the body terminal of the erase element 130 may cause leakage current. Therefore, the well bias line WBL1 coupled to the memory cell $100_{M,1,1}$ can also be at the second voltage VEE'.

In addition, the word line WLM can be at the third voltage VDD for reducing the gate-induced drain leakage (GIDL) current. For example, during the program operation of the memory cell $100_{1,1,1}$ and the program inhibit operation of the memory cell $100_{1,N,1}$, the source line $SL_{N,1}$ and the bit line $BL_{N,1}$ coupled to the memory cell $100_{M,N,1}$ are at the third voltage VDD. If the word line WLM is at the fourth voltage VSS, the big voltage difference may cause GIDL currents at the source transistor 114 and the bit transistor 116 of the memory cell $100_{M,N,1}$. Therefore, the word line WLM at the fourth voltage VIDD can avoid the GIDL currents efficiently while not affecting the operations of other memory cells.

Furthermore, in some embodiments of the present invention, the memory array 10 can be programmed by byte. That is, the memory cells $100_{1,1,1}$ to $100_{1,1,K}$ in the same memory byte $MB_{1,1}$ can perform the program operation simultaneously. In this case, the memory cell $100_{1,1,K}$ may receive the same signals as the memory cell $100_{1,1,1}$ during the program operation of the memory cell $100_{1,1,1}$. However, in some embodiments of the present invention, the memory array may be programmed by bit. That is, during the program operation of the memory cell $100_{1,1,1}$, the memory cell $100_{1,1,K}$ may perform a program inhibit operation to prevent from being programmed. In this case, the memory cell $100_{1,1,K}$ may receive the same signals as the memory cell $100_{1,N,1}$ during the program operation of the memory cell $100_{1,1,1}$.

Figure 4:
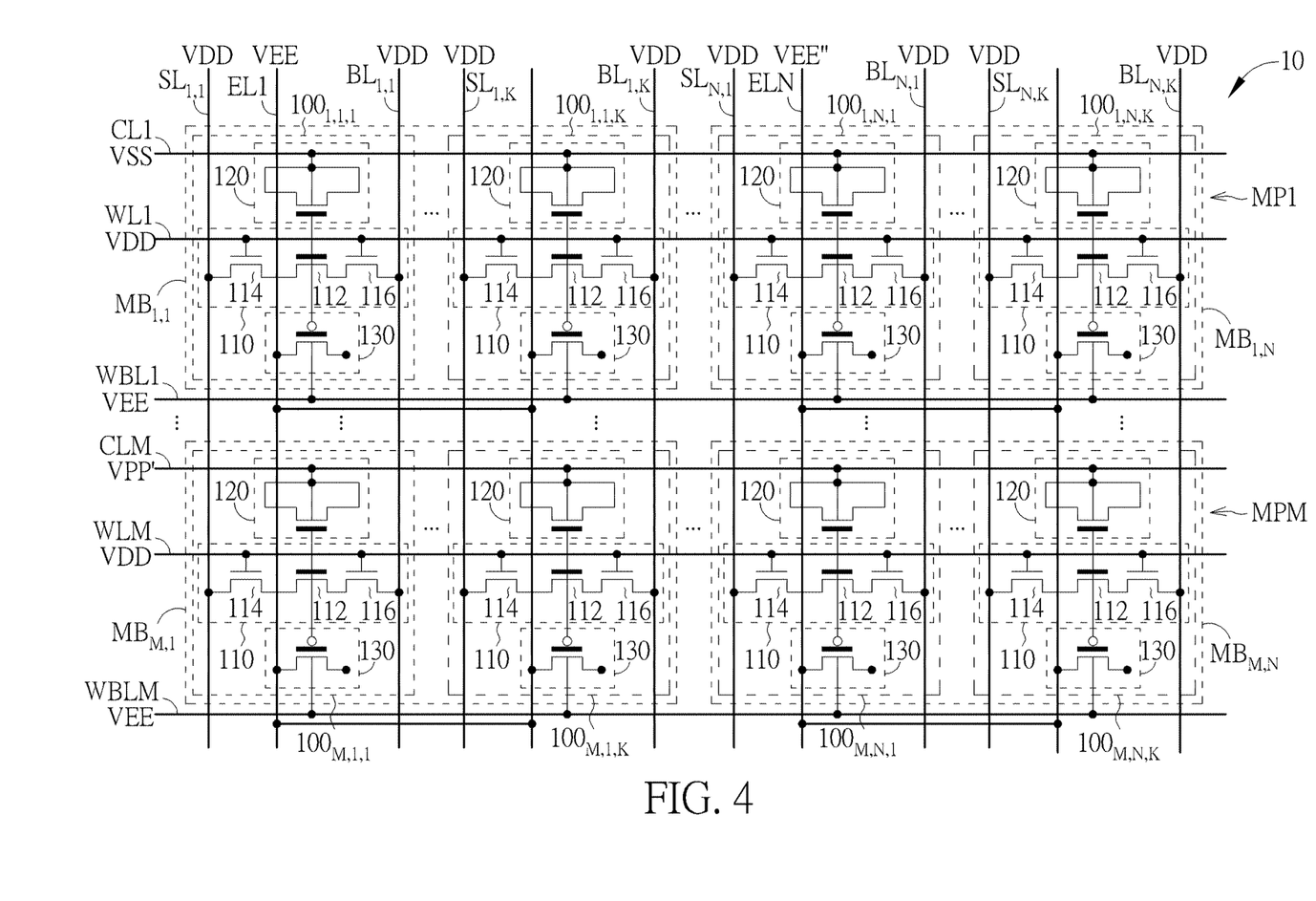
FIG. 4 shows voltages of signal lines during an erase operation of a memory cell of the memory array in FIG. 1.

FIG. 4 shows voltages of signal lines during an erase operation of the memory cell $100_{1,1,1}$ in the memory array 10. According to FIG. 4, during the erase operation of the memory cell $100_{1,1,1}$, the control line CL1 is at the fourth voltage VSS, the erase line EL1 is at a fifth voltage VEE, the word line WL1 is at the third voltage VDD, the source line $SL_{1,1}$ is at the third voltage VDD, the bit line $BL_{1,1}$ is at the third voltage VDD, and the well bias line WBL1 is at the fifth voltage VEE. The fifth voltage VEE is greater than the third voltage VDD. In some embodiments, the fifth voltage VEE can be substantially equal to or slightly smaller than the first voltage VPP. For example, the fifth voltage VEE can also be 10V as the first voltage VPP.

In this case, the high voltage of the erase line EL1 can cause FN electron tunneling ejection so the memory cell $100_{1,1,1}$ can be erased. In addition, since the erase line EL1 is at the fifth voltage VEE, the well bias line WBL would also be at the fifth voltage VEE for preventing the leakage current.

Furthermore, during the erase operation of the memory cell $100_{1,1,1}$, memory cells in unselected memory bytes of the same memory page MP1 as the memory cell $100_{1,1,1}$ should not be erased. For example, in FIG. 4, the memory cell $100_{1,N,1}$ is in the unselected memory byte $MB_{1,N}$, and should not be erased during the erase operation of the memory cell $100_{1,1,1}$.

Since the memory cell $100_{1,N,1}$ is in the same memory page MP1 as the memory cell $100_{1,1,1}$, the memory cell $100_{1,N,1}$ and the memory cell $100_{1,1,1}$ are coupled to the same control line CL1, the same word line WL1, and the same well bias line WBL1. Since the well bias line WBL1 is at the fifth voltage VEE during the erase operation of the memory cell $100_{1,1,1}$, the erase line ELN coupled to the memory cell $100_{1,N,1}$ should not be too low; otherwise, the erase element 130 of the memory cell $100_{1,N,1}$ may breakdown. Therefore, the erase line ELN coupled to the unselected memory cell $100_{1,N,1}$ can be at a sixth voltage VEE". The fifth voltage VEE is greater than the sixth voltage VEE", and the sixth voltage VEE" is greater than the fourth voltage VSS. In some embodiments of the present invention, the difference between the sixth voltage VEE" and the fourth voltage VSS can be smaller than half of the difference between the fifth voltage VEE and the fourth voltage VSS. For example, if the fifth voltage VEE is 10V, the sixth voltage can be 4V.

In this case, the voltage of erase line ELN is not high enough to cause FN electron tunneling ejection so the memory cell $100_{1,N,1}$ will not be erased. Also, the voltage of erase line ELN is not low enough to breakdown the erase element 130 of the memory cell $100_{1,N,1}$.

In addition to the erase line ELN coupled to the unselected memory cell $100_{1,N,1}$, the source line $SL_{N,1}$ coupled to the unselected memory cell $100_{1,N,1}$ is at the third voltage VDD, and bit line $BL_{N,1}$ coupled to the unselected memory cell $100_{1,N,1}$ is at the third voltage VDD during the erase operation of the memory cell $100_{1,1,1}$. Therefore, the memory cell $100_{1,N,1}$ will remain stable.

Furthermore, during the erase operation of the memory cell $100_{1,1,1}$, memory cells in unselected memory pages should not be erased. For example, in FIG. 4, the memory cell $100_{M,1,1}$ is in the unselected memory page MPM. However, since the memory cell $100_{M,1,1}$ is in the same column as the memory cell $100_{1,1,1}$, the memory cell $100_{M,1,1}$ and the memory cell $100_{1,1,1}$ are coupled to the same source line $SL_{1,1}$ the same bit line $BL_{1,1}$, and the same erase line EL1. Since the erase line EL1 is at the fifth voltage VEE, the voltage of the control line CLM coupled to the unselected memory cell $100_{M,1,1}$ should not be too low; otherwise, the memory cell $100_{M,1,1}$ may be erased unexpectedly. However, the voltage of the control line CLM should not be too high; otherwise, the memory cell $100_{M,1,1}$ may be programmed unexpectedly. Therefore, the control line CLM can be at a seventh voltage VPP'. The fifth voltage VEE is greater than the seventh voltage VPP', and the seventh voltage VPP' is greater than the third voltage VDD. In some embodiments of the present invention, the difference between the seventh voltage VPP' and the fourth voltage VSS is greater than half of the difference between the fifth voltage VEE and the fourth voltage VSS. For example, the seventh voltage VPP' can be 6V while the first fifth voltage VEE is 10V.

In this case, the voltage of the control line CLM would not be high enough to program the memory cell $100_{M,1,1}$, and would not be low enough to erase the memory cell $100_{M,1,1}$.

In addition to the control line CLM, the word line WLM coupled to the unselected memory cell $100_{M,1,1}$ is at the third voltage VDD, and the well bias line WBLM coupled to the unselected memory cell $100_{M,1,1}$ is at the fifth voltage VEE during the erase operation of the memory cell $100_{1,1,1}$. Therefore, the memory cell $100_{M,1,1}$ would remain stable.

Furthermore, since memory cells in one memory byte are coupled to the same erase line, the memory array 10 can be erased by byte. That is, the memory cells $100_{1,1,1}$ to $100_{1,1,K}$ in the same memory byte $MB_{1,1}$ can perform the erase operation simultaneously. In this case, the memory cell $100_{1,1,K}$ may receive the same signals as the memory cell $100_{1,1,1}$ during the program operation of the memory cell $100_{1,1,1}$.

Consequently, the memory array 10 can perform byte operations, such as byte program operations and/or byte erase operations, without receiving complicated signal lines. Furthermore, since the control elements 120 of memory cells of the same memory page can be disposed in the same well and the erase elements 130 of memory cells of the same memory page can be disposed in the same well, the circuit area can be shared in an efficient way. That is, the memory array 10 can have smaller circuit area compared to the prior art, and can support flexible operations efficiently.

However, during the erase operation of the memory cell $100_{1,1,1}$ as shown in FIG. 4, the erase line ELN coupled to the memory cell $100_{1,N,1}$ is at the sixth voltage VEE" while the well bias line WBL1 coupled to the memory cell $100_{1,N,1}$ is at the fifth voltage VEE. That is, the first terminal and the body terminal of the erase element 130 of the memory cell $100_{1,N,1}$ may endure a reverse voltage. When the memory array 10 is operated under a low voltage such as voltages not greater than 12V, the erase element 130 of the memory cell with manufacturing process of low voltage devices may still function normally and can endure the reverse voltage. For example, devices manufactured for operations of 3V may be suitable for the memory array 10. However, if the reverse voltage excesses an endurable range of the erase element 130 of the memory cell, then the erase element 130 may breakdown.

To allow the memory array to be operated with a higher voltage while not being broken down, the body terminal of the erase element may be coupled to the first terminal of the erase element in some embodiments of the present invention.

Figure 5:
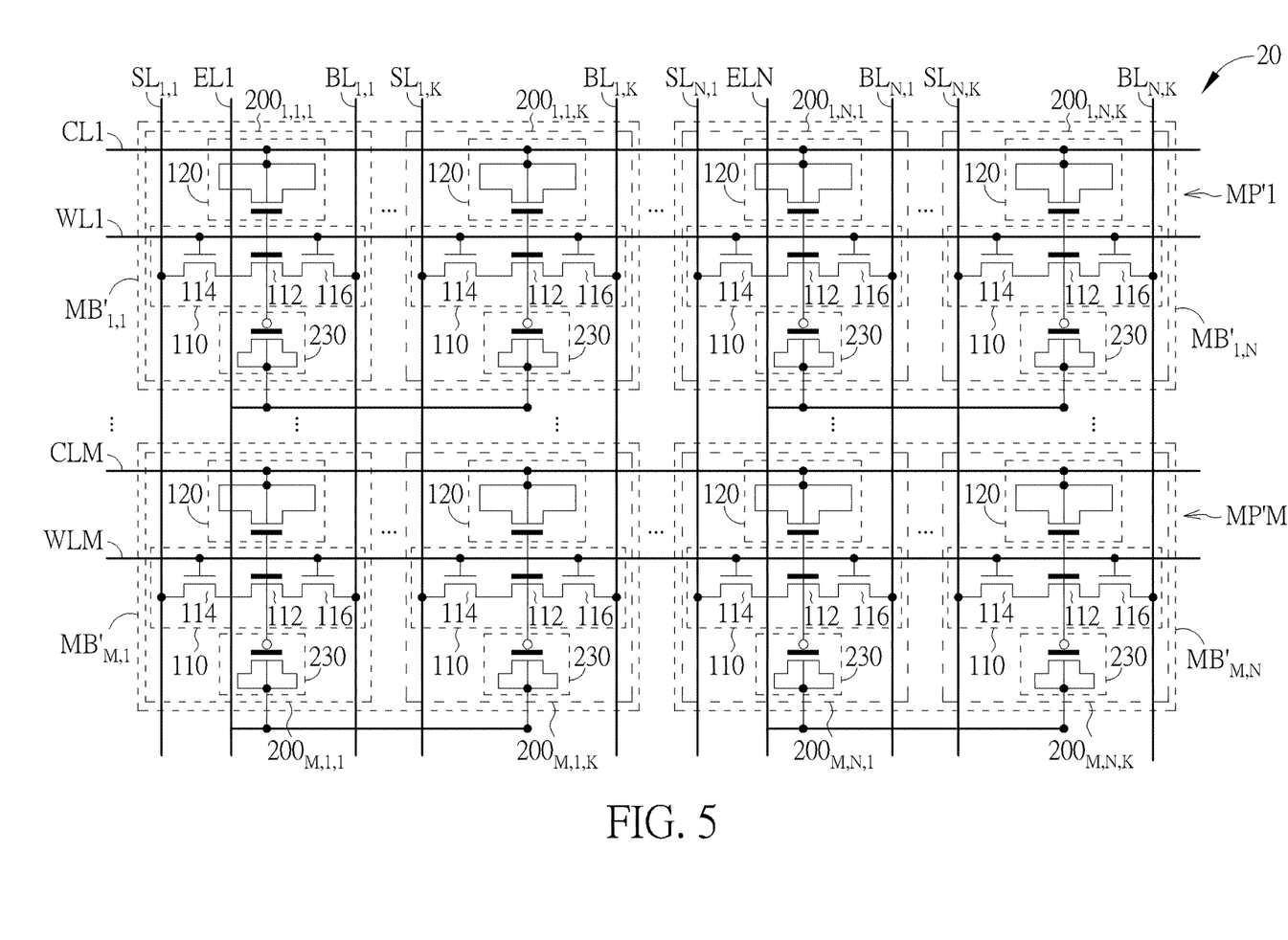
FIG. 5 shows a memory array according another embodiment of the present invention.

FIG. 5 shows a memory array 20 according one embodiment of the present invention. The memory array 20 and the memory array 10 have the similar structure. The memory array 10 includes M memory pages MP'1 to MP'M, each memory page includes N memory bytes. For example, the memory page MP'1 includes memory bytes $MB'_{1,1}$ to $MB'_{1,N}$, and the memory page MP'M includes memory bytes $MB'_{M,1}$ to $MB'_{M,N}$. Each memory byte $MB'_{1,1}$ to $MB'_{1,N}$, . . . , and $MB'_{M,1}$ to $MB'_{M,N}$ includes K memory cells, where M, N, and K are positive integer. For example, the memory byte $MB'_{1,1}$ includes memory cells $200_{1,1,1}$ to $200_{1,1,K}$, the memory byte $MB'_{1,N}$ includes memory cells $200_{1,N,1}$ to $200_{1,N,K}$, the memory byte $MB'_{M,1}$ includes memory cells $200_{M,1,1}$ to $200_{M,1,K}$, the memory byte $MB'_{M,N}$ includes memory cells $200_{M,N,1}$ to $200_{M,N,K}$.

Each memory cell includes the floating gate module 110, the control element 120, and an erase element 230. The erase element 230 and the erase element 130 have similar structures; however, the first terminal, the second terminal, and the body terminal of the erase element 230 of each memory cell in the memory array 20 are coupled to the first terminal of the erase element 230 for coupling to the corresponding erase line. That is, the well bias lines WBL1 to WBLM in memory array 10 can be removed in the memory array 20.

Figure 6:
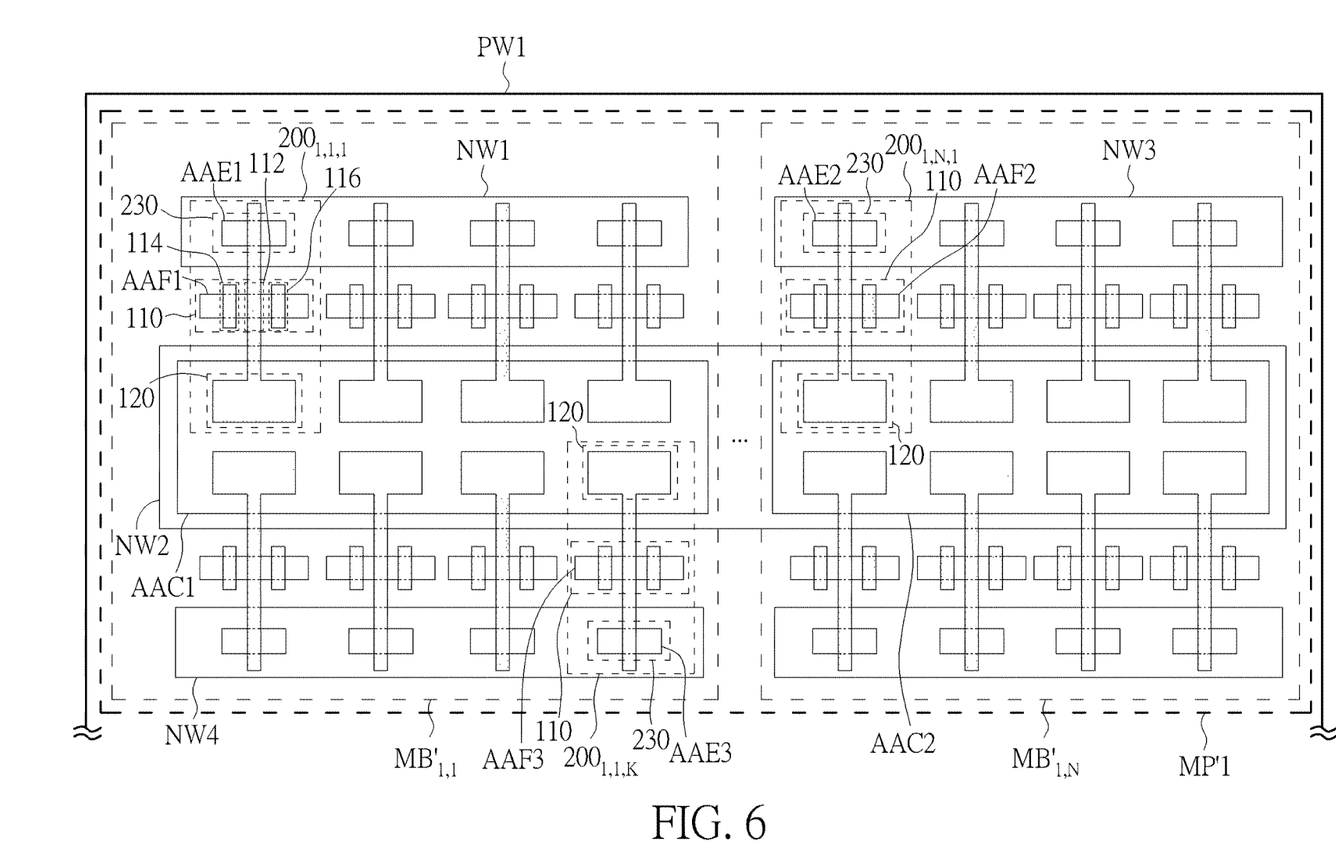
FIG. 6 shows a layout of a memory page of the memory array in FIG. 5 according to one embodiment of the present invention.

FIG. 6 shows a layout of the memory page MP'1 of the memory array 20 according to one embodiment of the present invention. The floating gate module 110 of the memory cell $200_{1,1,1}$ can be disposed in the active region AAF1 of the P-well PW1, the erase element 230 of the memory cell $200_{1,1,1}$ can be disposed in the active region AAE1 of the N-well NW1, and the control element 120 of the memory cell $200_{1,1,1}$ can be disposed in an active region AAC1 of the N-well NW2. The active region AAF1 is disposed between the N-well NW1 and the N-well NW2.

Also, the floating gate module 110 of the memory cell $200_{1,N,1}$ can be disposed in the active region AAF2 of the P-well PW1, and the control element 120 of the memory cell $200_{1,N,1}$ can be disposed in the active region AAC2 of the N-well NW2. However, since the well bias line coupled to the erase elements of memory cells in the same memory page is removed in memory array 20, the erase element 230 of the memory cell $200_{1,N,1}$ and the erase element 230 of the memory cell $200_{1,1,1}$ may be disposed in different N-wells. In FIG. 6, the erase element 230 of the memory cell $200_{1,N,1}$ can be disposed in the active region AAE2 of the N-well NW3. That is, erase elements 230 of the memory cells of different memory bytes can be disposed in different N-wells.

Also, control elements 120 of the memory cells in the same memory page may share the same N-well. For example, the memory bytes $MB'_{1,1}$ to $MB'_{1,N}$ of the same memory page MP'1 can share the N-well NW2. Furthermore, erase elements 230 of the memory cells in the same memory byte may share the same N-well. Therefore, the spacing rules between N-wells may not be used to limit the circuit area of the memory array 20, and the circuit area of the memory array 20 can be reduced significantly.

In addition, to avoid the circuit area of the memory array 20 from being extended to only one direction, floating gate modules 110 of one memory byte can be disposed in different active regions of the P-well PW1 and erase elements 230 of memory cells of one memory byte can be disposed in two different N-wells. For example, in FIG. 6, the floating gate module 110 of the memory cell $200_{1,1,1}$ of the memory byte $MB'_{1,1}$ can be disposed in the active region AAF1 of the P-well PW1 while floating gate module 110 of the memory cell $200_{1,1,K}$ of the memory byte $MB'_{1,1}$ can be disposed in the active region AAF3 of the P-well PW1.

Also, the erase element 230 of the memory cell $200_{1,1,1}$ of the memory byte $MB'_{1,1}$ can be disposed in the active region AAE1 of the N-well NW1 while the erase element 230 of the memory cell $200_{1,1,K}$ of the memory byte $MB'_{1,1}$ can be disposed in the active region AAE3 of an N-well NW4.

In this case, the layout of the memory array 20 will not extend to one single direction, and the layout of the memory array 20 can be more flexible. However, in some embodiments, the floating gate modules 110 of the memory cells $200_{1,1,1}$ to $200_{1,1,K}$ of the same memory byte $MB'_{1,1}$ can also be disposed in one P-well and the erase elements 230 of the memory cells $200_{1,1,1}$ to $200_{1,1,K}$ of the same memory byte $MB'_{1,1}$ can be disposed in one N-well according to the system requirements.

Figure 7:
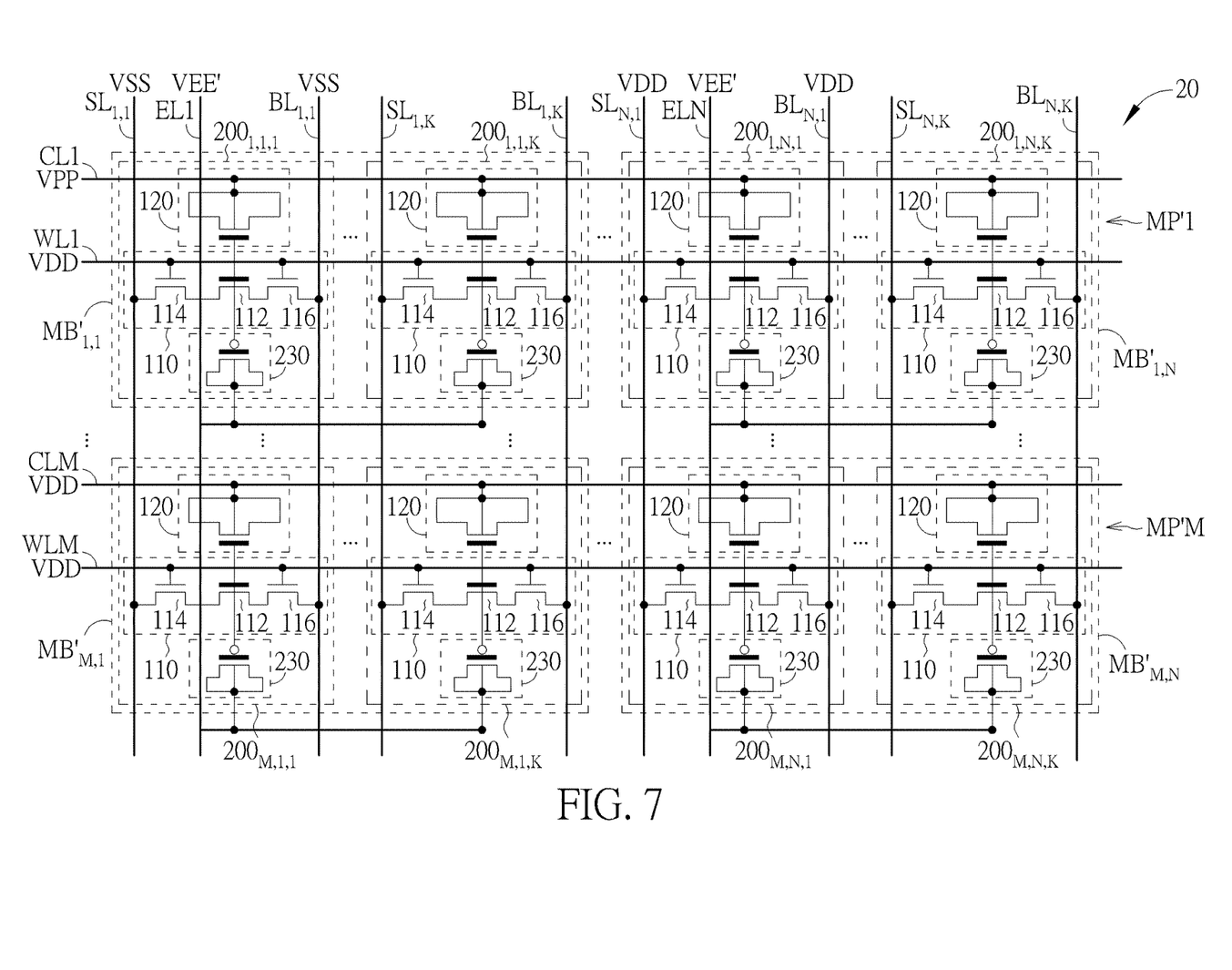
FIG. 7 shows voltages of signal lines during a program operation of a memory cell of the memory array in FIG. 5.

FIG. 7 shows voltages of signal lines during a program operation of the memory cell $200_{1,1,1}$ in the memory array 20. According to FIG. 7, during the program operation of the memory cell $200_{1,1,1}$, the control line CL1 is at a first voltage VPP, the erase line EL1 is at a second voltage VEE', the word line WL1 is at a third voltage VDD, the source line $SL_{1,1}$ is at a fourth voltage VSS, and the bit line $BL_{1,1}$ is at the fourth voltage VSS.

In some embodiments of the present invention, the memory array 20 can endure higher voltage than the memory array 10. For example, the memory array 20 may be implemented by devices manufactured for operations of 5V. In this case, the first voltage VPP can be 18V, the second voltage VEE' can be 13V, the third voltage VDD can be 6V, and the fourth voltage VSS can be 0V.

According to FIG. 7, the control element 120 of the memory cell $200_{1,1,1}$ is coupled to a high voltage by the control line CL1. The source transistor 114 and the bit transistor 116 are turned on so the first terminal and the second terminal of the floating gate transistor 112 of the memory cell $200_{1,1,1}$ are pulled down to a low voltage, the fourth voltage VSS. Therefore, the high voltage difference applied to the floating gate transistor 112 will induce FN (Fowler Nordheim) electron tunneling injection to the floating gate, and the memory cell $200_{1,1,1}$ can be programmed.

Also, during the program operation of the memory cell $200_{1,1,1}$, memory cell $200_{1,N,1}$ is unselected. Therefore, to prevent the memory cell $200_{1,N,1}$ in the same memory page MP'1 as the memory cell $200_{1,1,1}$ from being programmed during the program operation of the memory cell $200_{1,1,1}$, the memory cell $200_{1,N,1}$ may perform a program inhibit operation. During the program inhibit operation of the memory cell $200_{1,N,1}$, the control line CL1 is at the first voltage VPP, the erase line ELN is at the second voltage VEE', the word line WL1 is at the third voltage VDD, the source line $SL_{N,1}$ is at a third voltage VDD, and the bit line $BL_{N,1}$ is at the third voltage VDD.

In this case, although the memory cell $200_{1,N,1}$ is coupled to the same control line CL1 and the same word line WL1 as the memory cell $200_{1,1,1}$, the memory cell $200_{1,N,1}$ will not be programmed due to the effect of channel boost caused by the source transistor 114 and the bit transistor 116 of the memory cell $200_{1,N,1}$. That is, right after the voltage of control line CL1 ramping up to the first voltage VPP, the voltages of the first terminal and the second terminal of the floating gate transistor 112 will be isolated from the voltage of the source line $SL_{N,1}$ and the voltage of the bit line $BL_{N,1}$, but being coupled to a higher potential by the voltage of body terminal of the control element 120, so the floating gate of the memory cell $200_{1,N,1}$ is not able to capture enough electrons and the memory cell $200_{1,N,1}$ will not be programmed.

Furthermore, during the program operation of the memory cell $200_{1,1,1}$, memory cells in unselected memory pages should not be programmed. For example, in FIG. 7, the memory cell $200_{M,1,1}$ is in the unselected memory page MP'M. However, since the memory cell $200_{M,1,1}$ is in the same column as the memory cell $200_{1,1,1}$, the memory cell $100_{M,1,1}$ and the memory cell $200_{1,1,1}$ are coupled to the same source line $SL_{1,1}$ the same bit line $BL_{1,1}$, and the same erase line EL1.

During the program operation of the memory cell $200_{1,1,1}$, the control line CLM coupled to the unselected memory cell $200_{M,1,1}$ is at the third voltage VDD, and the word line WLM coupled to the unselected memory cell $200_{M,1,1}$ is at the third voltage VDD.

In this case, the memory cell $200_{M,1,1}$ will not be programmed since the voltage of the control line CLM is not high enough to induce FN electron tunneling. In addition, the word line WLM can be at the third voltage VDD for reducing the gate-induced drain leakage (GIDL) current. For example, during the program operation of the memory cell $200_{1,1,1}$ and the program inhibit operation of the memory cell $200_{1,N,1}$, the source line $SL_{N,1}$ and the bit line $BL_{N,1}$ coupled to the memory cell $200_{M,N,1}$ are at the third voltage VDD. If the word line WLM is at the fourth voltage VSS, the big voltage difference may cause GIDL currents at the source transistor 114 and the bit transistor 116 of the memory cell $200_{M,N,1}$. Therefore, the word line WLM at the fourth voltage VDD can avoid the GIDL currents efficiently while not affecting the operations of other memory cells.

Furthermore, in some embodiments of the present invention, the memory array 20 can be programmed by byte. That is, the memory cells $200_{1,1,1}$ to $200_{1,1,K}$ in the same memory byte $MB'_{1,1}$ can perform the program operation simultaneously. In this case, the memory cell $200_{1,1,K}$ may receive the same signals as the memory cell $200_{1,1,1}$ during the program operation of the memory cell $200_{1,1,1}$. However, in some embodiments of the present invention, the memory array may be programmed by bit. That is, during the program operation of the memory cell $200_{1,1,1}$, the memory cell $200_{1,1,K}$ may perform a program inhibit operation to prevent from being programmed. In this case, the memory cell $200_{1,1,K}$ may receive the same signals as the memory cell $200_{1,N,1}$ during the program operation of the memory cell $200_{1,1,1}$.

Figure 8:
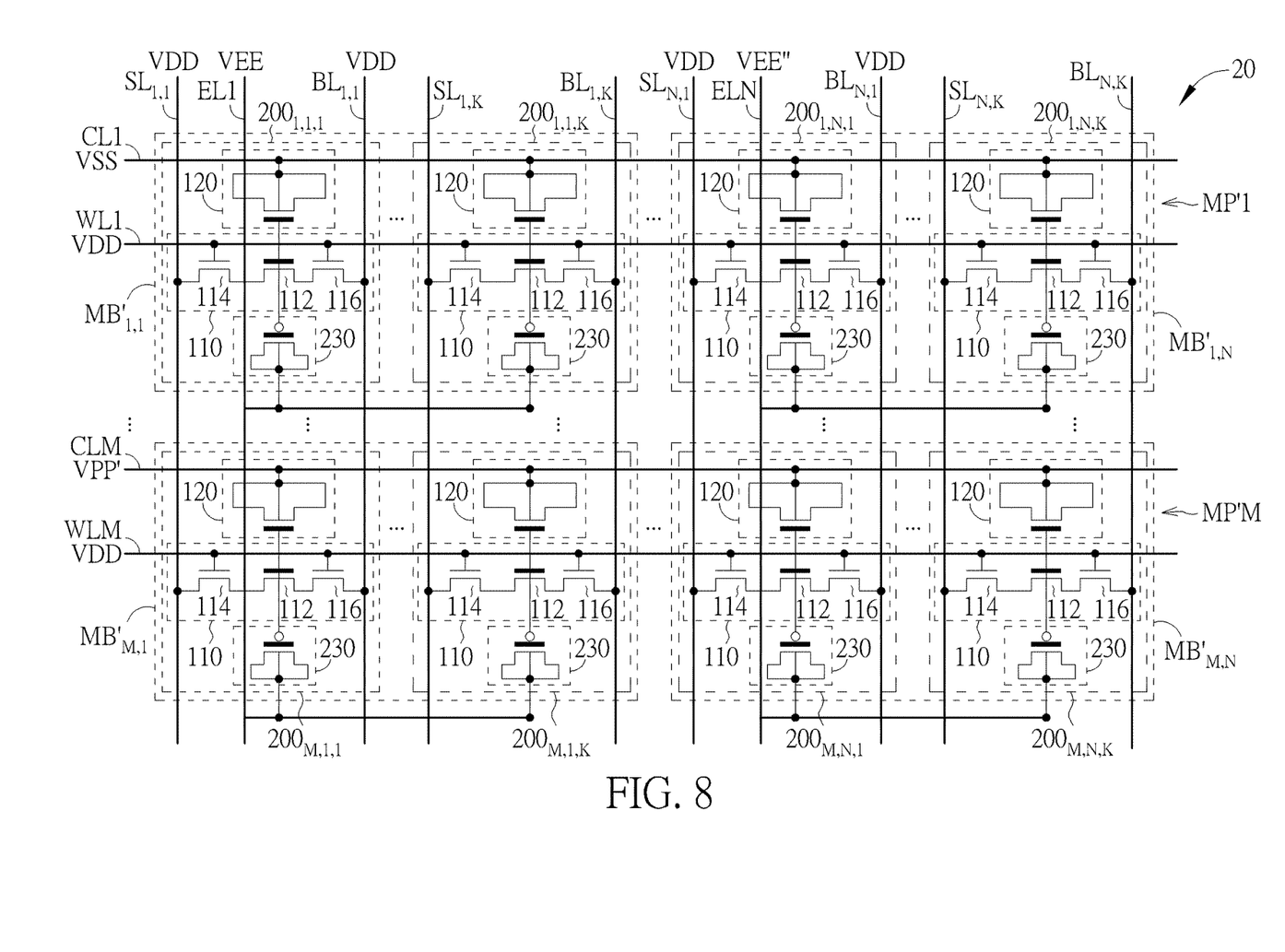
FIG. 8 shows voltages of signal lines during an erase operation of a memory cell of the memory array in FIG. 5.

FIG. 8 shows voltages of signal lines during an erase operation of the memory cell $200_{1,1,1}$ in the memory array 20. According to FIG. 8, during the erase operation of the memory cell $200_{1,1,1}$, the control line CL1 is at the fourth voltage VSS, the erase line EL1 is at the fifth voltage VEE, the word line WL1 is at the third voltage VDD, the source line $SL_{1,1}$ is at the third voltage VDD, and the bit line $BL_{1,1}$ is at the third voltage VDD. In the present embodiment, the fifth voltage VEE can be 18V as the first voltage VPP.

In this case, the high voltage of the erase line EL1 can cause FN electron tunneling ejection so the memory cell $200_{1,1,1}$ can be erased.

Furthermore, during the erase operation of the memory cell $200_{1,1,1}$, memory cells in unselected memory bytes of the same memory page MP'1 as the memory cell $200_{1,1,1}$ should not be erased. For example, in FIG. 8, the memory cell $200_{1,N,1}$ is in the unselected memory byte $MB'_{1,N}$, and should not be erased during the erase operation of the memory cell $200_{1,1,1}$.

Since the memory cell $200_{1,N,1}$ is in the same memory page MP'1 as the memory cell $200_{1,1,1}$, the memory cell $200_{1,N,1}$ and the memory cell $200_{1,1,1}$ are coupled to the same control line CL1, and the same word line WL1. However, the erase line ELN coupled to the unselected memory cell $200_{1,N,1}$ can be at the sixth voltage VEE''. In the present embodiment, the sixth voltage can be 4V while the fifth voltage VEE is 18V.

In this case, the voltage of erase line ELN is not high enough to cause FN electron tunneling ejection so the memory cell $200_{1,N,1}$ will not be erased.

In addition to the erase line ELN coupled to the unselected memory cell $200_{1,N,1}$, the source line $SL_{N,1}$ coupled to the unselected memory cell $200_{1,N,1}$ is at the third voltage VDD, and bit line $BL_{N,1}$ coupled to the unselected memory cell $200_{1,N,1}$ is at the third voltage VDD during the erase operation of the memory cell $200_{1,1,1}$. Therefore, the memory cell $200_{1,N,1}$ will remain stable.

Furthermore, during the erase operation of the memory cell $200_{1,1,1}$, memory cells in unselected memory pages should not be erased. For example, in FIG. 8, the memory cell $200_{M,1,1}$ is in the unselected memory page MP'M. However, since the memory cell $200_{M,1,1}$ is in the same column as the memory cell $200_{1,1,1}$, the memory cell $200_{M,1,1}$ and the memory cell $200_{1,1,1}$ are coupled to the same source line $SL_{1,1}$, the same bit line $BL_{1,1}$, and the same erase line EL1. Since the erase line EL1 is at the fifth voltage VEE, the voltage of the control line CLM coupled to the unselected memory cell $200_{M,1,1}$ should not be too low; otherwise, the memory cell $200_{M,1,1}$ may be erased unexpectedly. However, the voltage of the control line CLM should not be too high; otherwise, the memory cell $200_{M,1,1}$ may be programmed unexpectedly. Therefore, the control line CLM can be at the seventh voltage VPP'. In the present embodiment, the seventh voltage VPP' can be 12V while the fifth voltage VEE is 18V.

In this case, the voltage of the control line CLM would not be high enough to program the memory cell $200_{M,1,1}$, and would not be low enough to erase the memory cell $200_{M,1,1}$. In addition to the control line CLM, the word line WLM coupled to the unselected memory cell $200_{M,1,1}$ is at the third voltage VDD during the erase operation of the memory cell $200_{1,1,1}$. Therefore, the source transistor 114 and the bit transistor 116 can further prevent the memory cell $200_{M,1,1}$ from being erased by the effect of channel boost.

Furthermore, since memory cells in one memory byte are coupled to the same erase line, the memory array 20 can be erased by byte. That is, the memory cells $200_{1,1,1}$ to $200_{1,1,K}$ in the same memory byte $MB'_{1,1}$ can perform the erase operation simultaneously. In this case, the memory cell $200_{1,1,K}$ may receive the same signals as the memory cell $200_{1,1,1}$ during the program operation of the memory cell $200_{1,1,1}$.

Consequently, the memory array 20 can perform byte operations, such as byte program and/or byte erase, without complicated signal lines. Furthermore, since the control elements 120 of memory cells of the same memory page can be disposed in the same well and the erase elements 230 of memory cells of the same memory byte can be disposed in the same well, the circuit area can be shared in an efficient way. That is, the memory array 20 can have smaller circuit area compared to the prior art, and can support flexible operations efficiently.

Figure 9:
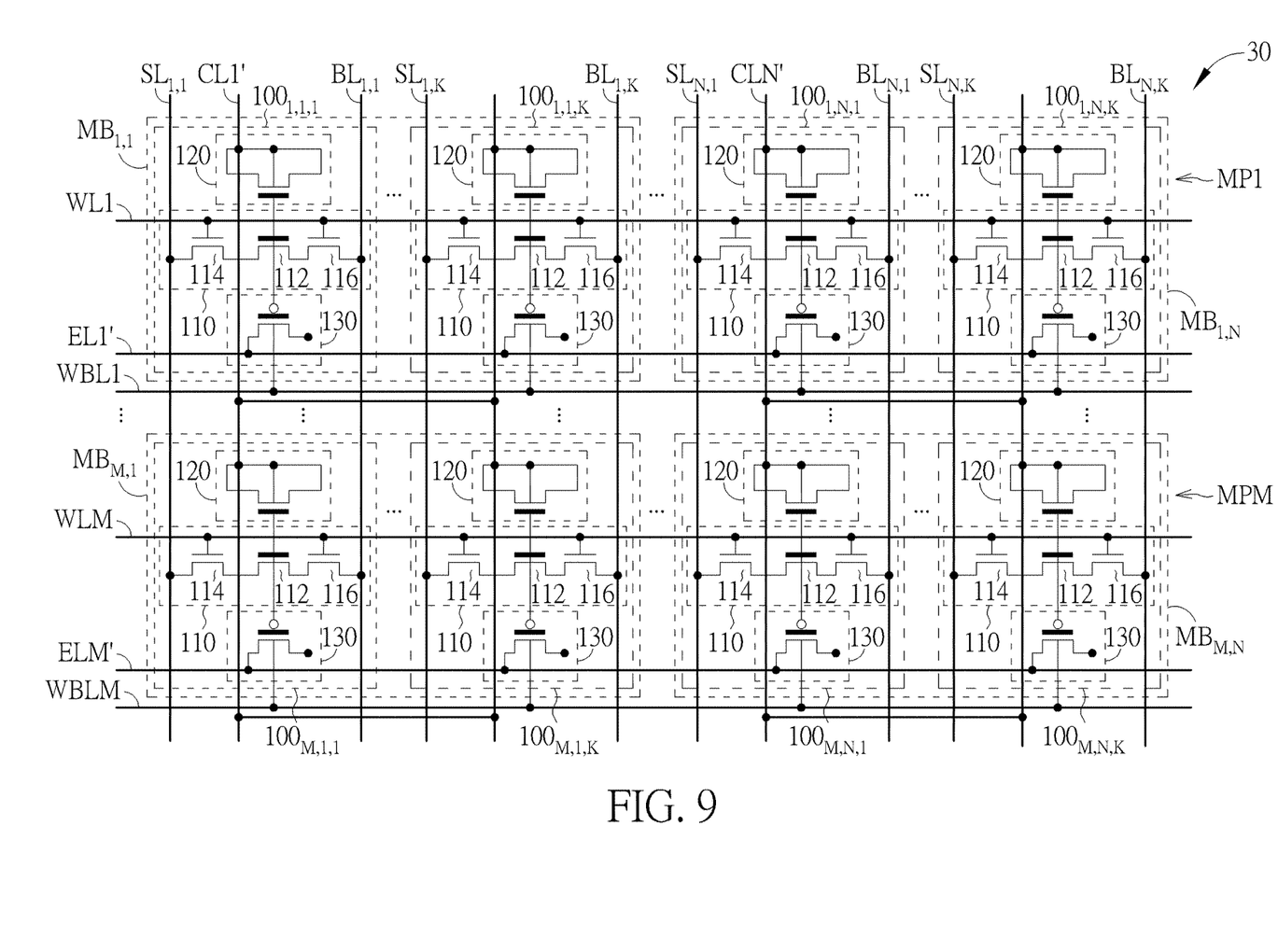
FIG. 9 shows a memory array according to another embodiment of the present invention.

In the memory arrays 10 and 20, the memory bytes of the same column are coupled to the same erase line, the memory bytes of different columns are coupled to different erase lines, the memory cells of the same memory page are coupled to a same control line, and the memory cells of different memory pages are coupled to different control lines. However, in some embodiments, the connecting arrangement of the control line and the erase line can be interchanged with each other. FIG. 9 shows a memory array 30 according to one embodiment of the present invention.

In FIG. 9, the memory array 30 has the similar structure as the memory array 10. However, in the memory array 30, the memory bytes of a same column can be coupled to a same control line, and memory bytes of different columns can be coupled to different control lines. For example, the memory byte $MB_{1,1}$ and the memory byte $MB_{M,1}$ are disposed in the same column and are coupled to the same control line CL1'. Also, the memory byte $MB_{1,N}$ and the memory byte $MB_{M,N}$ are disposed in the same column and are coupled to the same control line CLN'.

Also, in FIG. 9, the memory cells of a same memory page can be coupled to a same erase line, and the memory cells of different memory pages can be coupled to different erase lines. For example, the memory cells $100_{1,1,1}$ to $100_{1,1,K}$ and the memory cells $100_{1,N,1}$ to $100_{1,N,K}$ are in the same memory page MP1 and are coupled to the same erase line EL1'. Also, the memory cells $100_{M,1,1}$ to $100_{M,1,K}$ and the memory cells $100_{M,N,1}$ to $100_{M,N,K}$ are in the same memory page MPM and are coupled to the same erase line ELM'. In this case, the memory array 30 can still perform byte operations, such as byte program and/or byte erase, without complicated signal lines. That is, the memory array 30 can have smaller circuit area compared to the prior art, and can support flexible operations efficiently.

In summary, the memory arrays provided by the embodiments of the present invention can perform byte operations, such as byte program and/or byte erase, without complicated signal lines. Furthermore, since the control elements and the erase elements of different memory cells may share the same well in an efficient way, the memory arrays can have smaller circuit area compared to the prior art, and can support flexible operations efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
a plurality of memory pages, each memory page comprising a plurality of memory bytes, each memory byte comprising a plurality of memory cells, and each memory cell comprising:
 a floating gate module comprising:
  a floating gate transistor having a first terminal, a second terminal and a floating gate;
  a source transistor having a first terminal coupled to a source line, a second terminal coupled to the first terminal of the floating gate transistor, and a control terminal coupled to a word line; and
  a bit transistor having a first terminal coupled to the second terminal of the floating gate transistor, a second terminal coupled to a bit line, and a control terminal coupled to the word line;
 a control element having a body terminal coupled to a control line, a first terminal coupled to the body terminal, a second terminal coupled to the body terminal, and a control terminal coupled to the floating gate; and
 an erase element having a first terminal coupled to an erase line, a second terminal coupled to the first terminal of the erase element, a body terminal coupled to the first terminal of the erase element, and a control terminal coupled to the floating gate;
wherein:
memory bytes of a same column are coupled to a same erase line;
memory bytes of different columns are coupled to different erase lines;
during a program operation of the memory cell:
 the control line is at a first voltage;
 the erase line is at a second voltage;
 the word line is at a third voltage;
 the source line is at a fourth voltage; and
 the bit line is at the fourth voltage;
the first voltage is greater than the second voltage, the second voltage is greater than the third voltage, and the third voltage is greater than the fourth voltage;
a difference between the second voltage and the fourth voltage is greater than half of a difference between the first voltage and the fourth voltage; and
a difference between the third voltage and the fourth voltage is smaller than half of the difference between the first voltage and the fourth voltage.

2. The memory array of claim 1, wherein:
memory cells of a same memory page are coupled to a same control line; and
memory cells of different memory pages are coupled to different control lines.

3. The memory array of claim 1, wherein:
memory cells of a same memory page are coupled to a same word line; and
memory cells of different memory pages are coupled to different word lines.

4. The memory array of claim 1, wherein:
memory cells of the same column are coupled to a same source line and a same bit line; and
memory cells of different columns are coupled to different source lines and different bit lines.

5. The memory array of claim 1, wherein:
during the program operation of the memory cell:
 an erase line coupled to an unselected memory cell in a same memory page as the memory cell is at the second voltage;
 a source line coupled to the unselected memory cell is at the third voltage; and
 a bit line coupled to the unselected memory cell is at the third voltage.

6. The memory array of claim 1, wherein:
during the program operation of the memory cell:
 a control line coupled to an unselected memory cell in an unselected memory page but in a same column as the memory cell is at the third voltage; and
 a word line coupled to the unselected memory cell is at the third voltage.

7. A memory array, comprising:
a plurality of memory pages, each memory page comprising a plurality of memory bytes, each memory byte comprising a plurality of memory cells, and each memory cell comprising:
  a floating gate module comprising:
    a floating gate transistor having a first terminal, a second terminal and a floating gate;
    a source transistor having a first terminal coupled to a source line, a second terminal coupled to the first terminal of the floating gate transistor, and a control terminal coupled to a word line; and
    a bit transistor having a first terminal coupled to the second terminal of the floating gate transistor, a second terminal coupled to a bit line, and a control terminal coupled to the word line;
  a control element having a body terminal coupled to a control line, a first terminal coupled to the body terminal, a second terminal coupled to the body terminal, and a control terminal coupled to the floating gate; and
  an erase element having a first terminal coupled to an erase line, a second terminal coupled to the first terminal of the erase element, a body terminal coupled to the first terminal of the erase element, and a control terminal coupled to the floating gate;
wherein:
memory bytes of a same column are coupled to a same erase line;
memory bytes of different columns are coupled to different erase lines;
during an erase operation of the memory cell:
  the erase line is at a fifth voltage;
  the control line is at a fourth voltage;
  the word line is at a third voltage;
  the source line is at the third voltage; and
  the bit line is at the third voltage; and
the fifth voltage is greater than the third voltage, and the third voltage is greater than the fourth voltage.

8. The memory array of claim 7, wherein:
during the erase operation of the memory cell:
  an erase line coupled to an unselected memory cell in a same memory page as the memory cell is at a sixth voltage;
  a source line coupled to the unselected memory cell is at the third voltage; and
  a bit line coupled to the unselected memory cell is at the third voltage;
the fifth voltage is greater than the sixth voltage, and the sixth voltage is greater than the fourth voltage; and
a difference between the sixth voltage and the fourth voltage is smaller than half of a difference between the fifth voltage and the fourth voltage.

9. The memory array of claim 7, wherein:
during the erase operation of the memory cell,
  a control line coupled to an unselected memory cell in a different memory page from the memory cell is at a seventh voltage; and
  a word line coupled to the unselected memory cell is at the third voltage;
the fifth voltage is greater than the seventh voltage, and the seventh voltage is greater than the fourth voltage; and
a difference between the seventh voltage and the fourth voltage is greater than half of a difference between the fifth voltage and the fourth voltage.

* * * * *